(12) United States Patent
Uemura

(10) Patent No.: US 6,794,690 B2
(45) Date of Patent: Sep. 21, 2004

(54) GROUP III NITRIDE COMPOUND SEMICONDUCTOR LIGHT-EMITTING ELEMENT

(75) Inventor: Toshiya Uemura, Nishikasugai-gun (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 57 days.

(21) Appl. No.: 10/227,448

(22) Filed: Aug. 26, 2002

(65) Prior Publication Data

US 2003/0052328 A1 Mar. 20, 2003

(30) Foreign Application Priority Data

Sep. 18, 2001 (JP) .................................... P2001-283994
Apr. 23, 2002 (JP) .................................... P2002-120269

(51) Int. Cl.$^7$ .......................................... H01L 31/0328
(52) U.S. Cl. ...................... 257/183; 257/189; 257/200; 257/228; 257/293; 257/432
(58) Field of Search ................................. 257/183, 184, 257/200

(56) References Cited

U.S. PATENT DOCUMENTS

| 5,767,581 A | 6/1998 | Nakamura et al. |
| 6,281,524 B1 * | 8/2001 | Yamamoto et al. |
| 6,410,162 B1 * | 6/2002 | White et al. |

FOREIGN PATENT DOCUMENTS

| JP | 59-228776 | 12/1984 |
| JP | 02-068968 | 3/1990 |
| JP | 05-013816 | 1/1993 |
| JP | 05-129658 | 5/1993 |
| JP | 11-220171 | 8/1999 |

* cited by examiner

Primary Examiner—Fetsum Abraham
(74) Attorney, Agent, or Firm—McGinn & Gibb, PLLC

(57) ABSTRACT

A Group III nitride compound semiconductor light-emitting element (flip chip type light-emitting element) provided with a p-side electrode and an n-side electrode formed on one surface side, wherein the p-side electrode includes: a first metal layer containing Ag and formed on a p-type semiconductor layer; a protective film with which the first metal layer except a part region is covered; and a second metal layer not containing Ag and formed on the protective film.

7 Claims, 4 Drawing Sheets

GROUP III NITRIDE COMPOUND SEMICONDUCTOR LIGHT-EMITTING ELEMENT

The present application is based on Japanese Patent Applications Nos. 2001-283994 and 2002-120269, which are incorporated herein by reference.

BACKGROUND OF THE INVENTION

1. Field of the Invention

The present invention relates to a Group III nitride compound semiconductor light-emitting element. Particularly, it relates to improvement of a p-side electrode in a Group III nitride compound semiconductor light-emitting element provided with the p-side electrode and an n-side electrode both formed on one surface side.

2. Description of the Related Art

A so-called flip chip type light-emitting element provided with a p-side electrode and an n-side electrode both formed on one surface side is known as a Group III nitride compound semiconductor light-emitting element. The flip chip type light-emitting element is generally configured as shown in FIG. 4. That is, an n-type semiconductor layer 102, a light-emitting layer 103 and a p-type semiconductor layer 104 are formed successively on a light-transmissive substrate 101 such as a sapphire substrate. A p-side electrode 105 and a protective film 106 are formed on the p-type semiconductor layer 104. An n-side electrode 107 is formed on the n-type semiconductor layer 102. Light emitted from the light-emitting layer 103 is radiated out through the substrate 101. On this occasion, apart of light emitted from the light-emitting layer 103 moves toward the electrode side. To improve external radiation efficiency (luminance), it is therefore preferable that the part of light moving toward the electrode side is efficiently reflected by the p-side electrode 105 so as to be used as external radiating light. Hence, there has been a proposal for a configuration in which Ag (or Ag alloy) exhibiting high reflectance to the light emitted from a Group III nitride compound semiconductor light-emitting element is used as the material of the p-side electrode.

When the p-side electrode is made of such an Ag-based material, a high-luminance light-emitting element can be achieved but there arises a problem in reliability. That is, when the Ag-based material is used, there arises a problem that lowering of intensity of emitted light or reduction of the lifetime is caused by migration of Ag.

In the related-art example shown in FIG. 4, Ag in the p-side electrode 105 is distributed all over the p-side electrode 105 at a point of time when the protective film 106 is formed by heating after the p-side electrode 105 is formed. Further, a window 108 is provided in the protective film 106 to secure a bonding region. Accordingly, a region in which Ag is substantially exposed is present, so that migration of Ag occurs easily. On the other hand, another configuration (FIG. 5) has been disclosed in Unexamined Japanese Patent Publication No. Hei. 11-220171. In the disclosed configuration, a p-side electrode 111 made of an Ag-based material is covered with a metal layer 112 not containing Ag. A protective film 113 is further formed on the metal layer 112. Hence, the disclosed configuration can be expected to considerably suppress migration of Ag from the p-side electrode 111. A plasma CVD method in a high-temperature state is, however, used exclusively for forming a protective film 113 good in passivation. By this process history, Ag in the p-side electrode 111 is diffused into the metal layer 112 not containing Ag and provided just above the p-side electrode 111. For this reason, similarly to the configuration shown in FIG. 4, migration of Ag cannot be suppressed to a practical level because Ag is diffused into the metal layer surface where the window 114 of the protective film 113 is formed although the Ag concentration is low.

SUMMARY OF THE INVENTION

The invention is designed to solve the problem and an object of the invention is to provide a Group III nitride compound semiconductor light-emitting element with both high luminance and high reliability achieved by suppressing migration of Ag in a p-side electrode.

To achieve the foregoing object, the invention is configured as follows. That is, a Group III nitride compound semiconductor light-emitting element is provided with a p-side electrode and an n-side electrode both formed on one surface side, wherein the p-side electrode includes: a first metal layer containing Ag and formed on a p-type semiconductor layer; an electrically insulating protective film with which the first metal layer except a part region is covered; and a second metal layer not containing Ag and formed on the protective film.

According to this configuration, first, the light-emitting element can be provided as a light-emitting element high in external radiation efficiency because the use of the first metal layer containing Ag makes the semiconductor layer side surface of the p-side electrode have high reflectance so that light emitted from the light-emitting layer can be efficiently reflected by this surface. Moreover, migration of Ag from the first metal layer to the second metal layer can be suppressed effectively because the first metal layer and the second metal layer are electrically insulated from each other by the protective film except a part region. In other words, migration of Ag from the first metal layer to the p-side electrode surface (that is, the surface of the second metal layer) can be suppressed greatly, so that a highly reliable light-emitting element can be formed. On the other hand, electrical contact between the first metal layer and the second metal layer can be still sustained by the part region which is not shielded by the protective film. In this manner, a light-emitting element with both high luminous intensity and high reliability can be provided according to the configuration.

Features and advantages of the invention will be evident from the following detailed description of the preferred embodiments described in conjunction with the attached drawings.

DETAILED DESCRIPTION OF THE PREFERRED EMBODIMENTS

Figure 1:
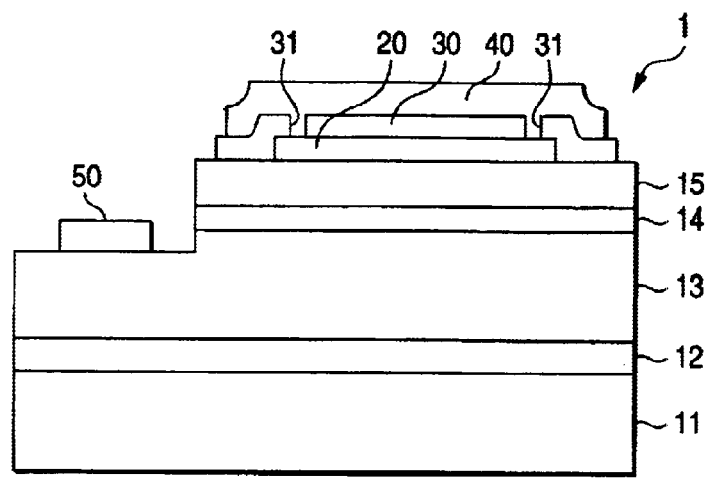
FIG. 1 is a schematic sectional view of a light-emitting element as an embodiment of the invention.

A Group III nitride compound semiconductor light-emitting element according to the invention is a so-called flip chip type light-emitting element provided with a p-side electrode and an n-side electrode both formed on one surface side. The "flip chip type light-emitting element" means a light-emitting element used in a flip chip type light-emitting device, that is, a light-emitting element used after mounted on a support such as a substrate while the surface side on which the p-side and n-side electrodes are formed is used as a mount surface. Emitted light is radiated from the substrate side, that is, a side opposite to the side where the electrodes are formed.

The "Group III nitride compound semiconductor light-emitting element" means a light-emitting element having a light-emitting layer made of Group III nitride compound semiconductor. The Group III nitride compound semiconductor is represented by the general formula $Al_xGa_yIn_{1-x-y}N$ ($0 \leq X \leq 1$, $0 \leq Y \leq 1$, $0 \leq X+Y \leq 1$), which includes so-called binary compounds such as AlN, GaN and InN, so-called ternary compounds such as $Al_xGa_{1-x}N$, $Al_xIn_{1-x}N$ and $Ga_xIn_{1-x}N$ ($0<x<1$), and so-called quarternary compounds such as $Al_xGa_yIn_{1-x-y}N$ ($0<x<1$, $0<y<1$, $0<x+y<1$). The Group III elements may be partially replaced by boron (B), thallium (Tl), or the like. The nitrogen (N) may be partially replaced by phosphorus (P), arsenic (As), antimony (Sb), bismuth (Bi), or the like. The Group III nitride compound semiconductor layer may contain any optional dopant. Si, Ge, Se, Te, C, or the like, may be used as n-type impurities. Mg, Zn, Be, Ca, Sr, Ba, or the like, may be used as p-type impurities.

The Group III nitride compound semiconductor layer can be formed by a known method such as a metal organic chemical vapor deposition method (MOCVD method), a molecular beam epitaxy method (MBE method), a halide vapor phase epitaxy method (HVPE method), a sputtering method, an ion-plating method, and an electron shower method.

Incidentally, after doped with p-type impurities, the Group III nitride compound semiconductor may be subjected to electron beam irradiation, plasma irradiation or heating in a furnace, but this step is not essential.

Respective constituent members of the invention will be described below in more detail.

The p-side electrode includes: a first metal layer containing Ag and formed on a p-type semiconductor layer; a protective film with which the first metal layer except a part region is covered; and a second metal layer not containing Ag and formed on the protective film. The second metal layer contacts the first metal layer at the part region of the first metal layer. Hence, the first metal layer, the protective film and the second metal layer are laminated successively viewed from the p-type semiconductor layer side. Although description in this specification is made upon the case where the laminate of the first metal layer, the protective film and the second metal layer is referred to as "p-side electrode", it maybe also conceived that only the first metal layer is regarded as a p-side electrode and the protective film and the second metal layer are regarded as a protective film and a metal layer formed successively on the p-side electrode. Further alternatively, it may be conceived that the laminate of the first metal layer and the protective film is regarded as a p-side electrode and the second metal layer is regarded as a metal layer formed on the p-side electrode.

The first metal layer is a metal layer containing Ag. When Ag is contained in the first metal layer, the surface of the first metal layer exhibits high reflectance so that light emitted from the light-emitting layer can be efficiently reflected by the p-side electrode surface.

Preferably, Ni, Co, Au, Pd, Pt, etc. may be added to the first metal layer in order to improve adhesive property between the first metal layer and the p-type semiconductor layer. At least two members selected from this group optionally may be used in combination.

Although the first metal layer may be formed as a single layer of Ag or Ag alloy, it is preferable that the first metal layer is formed as a laminate of a plurality of layers different in composition. For example, a laminate of a layer for enhancing adhesive property between the first metal layer and the p-type semiconductor layer (hereinafter referred to as "first adhesive layer") and a layer of an Ag-based material (Ag or Ag alloy) (hereinafter referred to as "Ag-based material layer") may be used as the first metal layer. According to this configuration, the first adhesive layer can enhance adhesive property between the p-type semiconductor layer and the Ag-based material layer, so that the first metal layer can be consequently formed on the p-type semiconductor layer with high adhesive property. Examples of the material for forming the first adhesive layer include Ni, Co, Au, Pd, and Pt. At least two members selected from this group may be used in combination. Ag may be used as one of materials for forming the first adhesive layer.

The first adhesive layer used here may be constituted by at least two layers different in composition. For example, the first adhesive layer may be constituted by a lower layer of Ni, Co, Pd or Pt and an upper layer of Au or Au alloy. According to this configuration, adhesive property between the first adhesive layer and the Ag-based material layer formed thereon can be improved more greatly, so that the first metal layer can be bonded onto the p-type semiconductor layer with higher reliability. When the first adhesive layer is constituted by two layers, that is, upper and lower layers, it is preferable that the thickness of the lower layer is smaller than that of the upper layer. This is because increase in contact resistance between the p-type semiconductor layer and the first metal layer due to the lower layer can be suppressed when the lower layer is made thin. This is also because the lower layer and the Ag-based material layer can be bonded to each other well by the upper layer when the upper layer is made thick to a certain degree. The thickness of the lower layer is, for example, in a range of from 0.1 nm to 50 nm, preferably in a range of from 0.5 nm to 20 nm. The thickness of the upper layer is, for example, in a range of from 1 nm to 500 nm, preferably in a range of from 5 nm to 200 nm.

Preferably, a layer for enhancing adhesive property between the Ag-based material layer and the protective layer which will be described later (hereinafter referred to as "second adhesive layer") may be formed on the Ag-based material layer. That is, a configuration in which the first adhesive layer, the Ag-based material layer and the second adhesive layer are laminated successively may be provided as a preferred embodiment of the first metal layer. The second adhesive layer may be made of a material such as Al, Ti, Cr, Ni, Co, Au, Pd or Pt. Alternatively, at least two selected from these materials may be used in combination.

Ag may be used as one of materials for forming the second adhesive layer.

The second adhesive layer may be constituted by at least two layers different in composition. For example, the second adhesive layer may be constituted by two layers, that is, a lower layer of Au or Au alloy and an upper layer of Al, Ti, Cr, Ni, Co, Pd or Pt. According to this configuration, adhesive property between the second adhesive layer and the protective film (which will be described later) formed thereon can be improved.

The thickness of each layer in the case where the second adhesive layer is constituted by two layers, that is, an upper layer and a lower layer, is not particularly limited. For example, the thickness of the lower layer is in a range of from 1 nm to 1,000 nm, preferably in a range of from 10 nm to 300 nm. The reason why the thickness range of the lower layer is adopted thus is as follows. If the Au layer or Au-containing layer which is the lower layer is too thick, Ag is mixed with Au easily so that reflectance of Ag is lowered due to alloying of Ag with Au at the time of heating. If the Au layer or Au-containing layer which is the lower layer is contrariwise too thin, adhesive strength between Ag and the upper layer is lowered. For example, the thickness of the upper layer is in a range of from 1 nm to 1,000 nm, preferably in a range of from 10 nm to 300 nm. The reason why the thickness range of the upper layer is adopted thus is as follows. If the upper layer is too thin, adhesive strength between the upper layer and the protective film or second metal layer formed thereon is lowered. If the upper layer is contrariwise too thick, the amount of a metal diffused into the Ag layer is increased to thereby cause increase in contact resistance.

Preferably, the total thickness of the first metal layer is in a range of from 50 to 3,000 nm. If the first metal layer is thinner than 50 nm, light reflectance is lowered. If the first metal layer is thicker than 3,000 nm, the problem in increase of resistance value and increase of production cost is manifested. Further preferably, the thickness of the first metal layer is in a range of from 200 nm to 1,500 nm.

An electrically insulating protective film is formed on the first metal layer. The protective film is formed so that the first metal layer except a part region is covered with the protective film. Preferably, the protective film is formed so that the exposed surface of the first metal layer, that is, an upper surface and side surfaces of the first metal layer can be wholly covered with the protective film and so that the protective film has at least one through-hole which reaches the upper surface of the first metal layer. According to this configuration, electrical contact between the first metal layer and the second metal layer (which will be described later) formed on the protective film can be sustained through the through-hole reaching the upper surface of the first metal layer while migration of Ag in the first metal layer is suppressed extremely. Because the path through which Ag in the first metal layer can be substantially migrated is only the through-hole, the amount of migration of Ag can be suppressed greatly. Preferably, the through-hole is made minute in order to reduce the amount of migration of Ag more. For example, the diameter of the through-hole is preferably set to be not larger than 50 $\mu$m. The diameter of the through-hole is further preferably set to be not larger than 10 $\mu$m. The lower limit of the diameter of the through-hole is not particularly limited. For example, the diameter of the through-hole is set to be in a range of from 0.1 $\mu$m to 50 $\mu$m, preferably in a range of from 1 $\mu$m to 50 $\mu$m, further preferably in a range of from 1 $\mu$m to 10 $\mu$m.

A plurality of through-holes may be provided in the protective film. According to this configuration, the Ag migration suppressing effect obtained by current dispersion can be fulfilled as well as the current path is dispersed to make electrical characteristic good. When a plurality of through-holes are provided, the through-holes are preferably positioned so that the through-holes are provided to be dispersed as evenly as possible. According to this configuration, the current path in the p-side electrode can be dispersed so evenly that improvement of electrical characteristic can be attained. For example, a plurality of through-holes can be provided at regular intervals on the outer circumferential portion of the upper surface of the first metal layer.

Examples of the electrically insulating material for forming the protective film include silicon oxide, silicon nitride, aluminum oxide, and titanium nitride. Specific examples thereof which can be used include $SiO_2$, $Si_3O_4$, $SiN_x$, $SiO_xN_y$, $Al_2O_3$, and TiN.

The thickness of the protective film is not particularly limited. For example, the thickness of the protective film can be set to be in a range of from 50 nm to 500 nm, preferably in a range of from 200 nm to 3,000 nm. This is because the side surfaces of the first electrode layer can be covered (subjected to side coverage or step coverage) steadily when the protective film is made thicker than the first electrode layer. This is also because production efficiency is lowered if the protective film is too thick.

The second metal layer is formed on the protective film. The second metal layer is a metal layer which does not contain Ag and which can be made of one member selected from the group consisting of Ti, Au, V, Ni, Cr, Zr, Co, Au, Rh, Pt, Cu, Al, Mg, Pd, Mn, Bi, Sn, and Re. Alternatively, the second metal layer may be made of at least two members optionally selected from this group.

The second metal layer may be formed as a laminate of at least two layers different in composition. For example, the second metal layer may be constituted by a laminate of a lower layer of Ti, Au, V, Ni, Cr, Zr, Co, Rh, Pt, Cu, Al, Mg, Pd, Mn, Bi, Sn or Re and an upper layer of Au or Au alloy. According to this configuration, good adhesive property between the second metal layer and the protective film and good adhesive property between the second metal layer and an Au bump used for junction with an external substrate or the like can be obtained. Incidentally, from the point of view of facilitating formation of the second metal layer by vapor deposition and obtaining extremely excellent adhesive property between the second metal layer and the protective film, it is particularly preferable that Ti, Cr or V is used as the material of the lower layer.

When the second metal layer is constituted by two layers, that is, a lower layer and an upper layer, it is preferable that the lower layer is thinner than the upper layer. This is because it is conceivable that, if the lower layer is made thicker, the component of the lower layer is diffused into the first electrode layer by long-term current conduction and thermal load to thereby increase contact resistance between the p-type layer and the first electrode layer. This is also because good adhesive property between the second metal layer and an Au bump can be ensured in assembling when the upper layer is made thicker. For example, the thickness of the lower layer is in a range of from 1 nm to 1,000 nm, preferably in a range of from 5 nm to 200 nm. For example, the thickness of the upper layer is in a range of from 50 nm to 10,000 nm, preferably in a range of from 200 nm to 2,000 nm.

The total thickness of the second metal layer is not particularly limited. For example, the total thickness of the second metal layer is preferably set to be in a range of from 100 nm to 10 μm. When the thickness is set to be not smaller than 100 nm, electrical contact between the second metal layer and the first metal layer can be secured sufficiently and adhesive property between the second metal layer and an Au bump in assembling can be secured sufficiently. On the other hand, when the thickness is set to be not larger than 10 μm, increase in resistance value and increase in production cost can be suppressed.

Further preferably, the thickness of the second metal layer is in a range of from 200 nm to 3,000 nm.

For example, the light-emitting element according to the invention can be produced as follows.

First, a substrate on which Group III nitride compound semiconductor layers can be grown is prepared. A plurality of semiconductor layers are laminated on the substrate so that an n-type Group III nitride compound semiconductor layer, a layer containing a light-emitting layer of a Group III nitride compound semiconductor and a p-type Group III nitride compound semiconductor layer are arranged as the plurality of semiconductor layers in this order. Examples of the material of the substrate include sapphire, spinel, silicon, silicon carbide, zinc oxide, gallium phosphide, gallium arsenide, magnesium oxide, manganese oxide, and Group III nitride compound semiconductor monocrystal.

Then, etching is applied to thereby reveal a part of the n-type semiconductor layer. Then, both the p-side electrode and the n-side electrode are formed on the p-type Group III nitride compound semiconductor layer and the n-type Group III nitride compound semiconductor layer respectively. The p-side electrode can be formed as follows. First, a first electrode layer is formed by a known method such as an MBE method, a vacuum vapor deposition method or a sputtering method. Then, an electrically insulating protective film is formed by a method such as a plasma CVD method, a sputtering method or a vacuum vapor deposition method so that a surface of the first metal layer is covered with the protective film. Then, at least one through-hole is provided in a part of the protective film by a method such as photo-etching so that the hole reaches the surface of the first metal layer. Then, a second metal layer is formed on the protective film in the same manner as the first metal layer.

The n-side electrode can be formed by a known method such as a vacuum vapor deposition method or a sputtering method.

As described above, the p-side electrode in the invention is configured so that a laminate of the first metal layer, the protective film and the second metal layer in this order is formed as the p-side electrode after the p-type semiconductor layer is formed. It is preferable that heating is performed at a temperature not higher than the deposition temperature of the Group III nitride compound semiconductor before the second metal layer is formed (that is, after the first metal layer is formed or after the protective film is formed). By the heating, interfacial resistance between the first metal layer and the p-type semiconductor layer can be reduced, so that a light-emitting element excellent in electrical characteristic can be produced. The temperature required for the heating here is particularly preferably set to be in a range of from 400° C. to 700° C.

If heating at a high temperature is performed after the formation of the second metal layer, Ag is diffused from the first electrode layer to the second metal layer by the heating to thereby bring about a fear that the diffusion of Ag may cause migration of Ag to the surface of the second electrode layer. When heating is performed before the formation of the second metal layer, such diffusion of Ag can be, however, prevented. In this case, the path through which Ag can be substantially migrated to the second electrode layer surface (that is, the p-side electrode surface) is only the hole which is provided in the protective film to secure electrical contact. Accordingly, the amount of migration of Ag can be suppressed greatly.

The configuration of the invention will be described below in more detail in connection with embodiments thereof.

Embodiment 1

FIG. 1 is a view typically showing the configuration of a light-emitting element 1 as an embodiment of the invention. Specifications of respective layers in the light-emitting element 1 are as follows.

| Layer | Composition |
| --- | --- |
| p-type layer 15 | p-GaN: Mg |
| Layer 14 containing light-emitting layer | including an InGaN layer |
| n-type layer 13 | n-GaN: Si |
| Buffer layer 12 | AlN |
| Substrate 11 | sapphire |

The n-type layer 13 made of GaN doped with Si as n-type impurities is formed on the substrate 11 through the buffer layer 12. Although this embodiment has been described upon the case where sapphire is used as the material of the substrate 11, the material of the substrate 11 is not limited thereto. For example, sapphire, spinel, silicon, silicon carbide, zinc oxide, gallium phosphide, gallium arsenide, magnesium oxide, manganese oxide, or Group III nitride compound semiconductor monocrystal may be used as the material of the substrate 11. Although this embodiment has been described upon the case where the buffer layer is made of AlN by an MOCVD method, the material and method for forming the buffer layer are not limited thereto. GaN, InN, AlGaN, InGaN, AlInGaN, or the like, may be used as the material of the buffer layer. A molecular beam epitaxy method (MBE method), a halide vapor phase epitaxy method (HVPE method), a sputtering method, an ion-plating method, an electron shower method, or the like, maybe used as the method for forming the buffer layer. When Group III nitride compound semiconductor is used as the material of the substrate, the buffer layer may be omitted.

Further, the substrate and the buffer layer can be removed if necessary after the semiconductor element is formed.

Although this embodiment has shown the case where the n-type layer is made of GaN, the invention may be applied also to the case where AlGaN, InGaN or AlInGaN is used as the material of the n-type layer.

Although this embodiment has shown the case where the n-type layer is doped with Si as n-type impurities, the invention may be applied also to the case where Ge, Se, Te, C, or the like, is used as n-type impurities.

The n-type layer 13 may be of a double-layered structure with an n⁻ layer of low electron density on the layer 14 side and an n⁺ layer of high electron density on the buffer layer 12 side.

The layer 14 may contain a light-emitting layer having a quantum well structure. A single or double hetero type structure or a homojunction type structure may be used as the structure of the light-emitting element.

The layer 14 may contain a Group III nitride compound semiconductor layer doped with an acceptor such as magnesium on the p-type layer 15 side and having a wide band gap. This is a technique for effectively preventing electrons injected into the layer 14 from diffusing into the p-type layer 15.

The p-type layer 15 made of GaN doped with Mg as p-type impurities is formed on the layer 14. Alternatively, the p-type layer may be made of AlGaN, InGaN or InAlGaN. Zn, Be, Ca, Sr or Ba may be used as p-type impurities instead.

The p-type layer 15 may be of a double-layered structure with a p⁻ layer of low hole density on the layer 14 side and a p⁺ layer of high hole density on the electrode side.

In the light-emitting diode configured as described above, each of the Group III nitride compound semiconductor layers may be formed by execution of MOCVD in a general condition or may be formed by a method such as a molecular beam epitaxy method (MBE method), a halide vapor phase epitaxy method (HVPE method), a sputtering method, an ion-plating method or an electron shower method.

After the p-type layer 15 is formed, the p-type layer 15, the layer 14 and the n-type layer 13 are partially removed by etching to thereby reveal a part of the n-type layer 13. A V film 20 nm thick and an Al film 2,000 nm thick are formed successively on the revealed part of the n-type layer 13 by vapor deposition. Thus, the n-side electrode 50 is formed.

Figure 2:
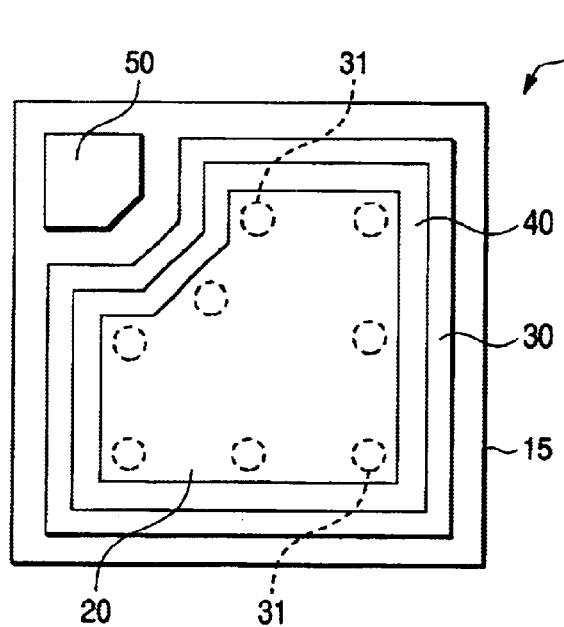
FIG. 2 is a top view of the light-emitting element.

Sequentially, a first metal layer 20 of Ag is formed on a predetermined region on the p-type layer 15 by vapor deposition so that the first metal layer 20 has a thickness of 300 nm. After that, the first metal layer 20 is alloyed in the condition of about 600° C. for 3 minutes and in an N₂ atmosphere. Then, an SiO₂ film 30 as a protective film with a thickness of 300 nm is formed by a plasma CVD method so that the whole surface of the fist metal layer 20 is covered with the SiO₂ film 30. Then, through-holes 31 each having a diameter of 50 nm and passing through the SiO₂ film 30 are provided by etching as shown in FIGS. 1 and 2. Incidentally, FIG. 2 is a top view of the light-emitting element 1.

Then, a second metal layer 40 of Au is formed on the SiO₂ film 30 so that the second metal layer 40 has a thickness of 1,500 nm. After these steps, the wafer is separated into chips by use of a scriber or the like.

Embodiment 2

Figure 3:
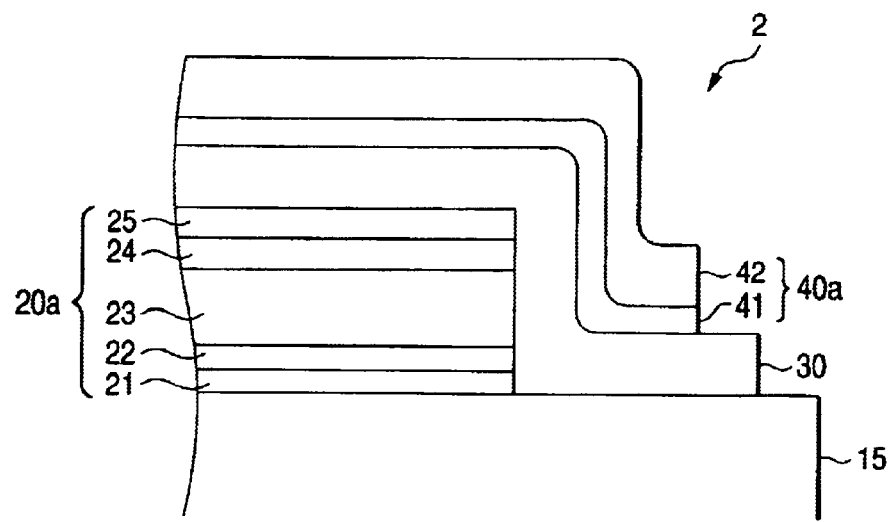
FIG. 3 is a partly enlarged view showing the configuration of a p-side electrode in a light-emitting element as another embodiment of the invention.

A light-emitting element 2 as another embodiment of the invention will be described below. In the light-emitting element 2, a configuration constituted by a plurality of layers is used as the configuration of each of the first metal layer formed on the p-type layer and the second metal layer formed through the protective film. That is, as shown in FIG. 3, a first metal layer 20a constituted by a laminate of a first layer 21 of Co, a second layer 22 of Au, a third layer 23 of Ag, a fourth layer 24 of Au and a fifth layer 25 of Ni in this order, and a second metal layer 40a constituted by a laminate of a Ti layer 41 and an Au layer 42 in this order are used. The light-emitting element 2 as to the other configuration thereof is the same as the light-emitting element 1 (see FIGS. 1 and 2). The first layer 21 and the second layer 22 serve as the first adhesive layer, and the fourth layer 24 and the fifth layer 25 serve as the second adhesive layer.

The light-emitting element 2 is formed as follows. A first layer 21 of Co, a second layer 22 of Au, a third layer 23 of Ag, a fourth layer 24 of Au and a fifth layer 25 of Ni are formed successively on a predetermined region on the p-type layer 15 by vapor deposition so that the layers 21 to 25 have thicknesses of 1 nm, 15 nm, 300 nm, 50 nm and 50 nm respectively. Thus, a first metal layer 20a is formed. Then, the first metal layer 20a is alloyed in the condition of about 600° C., for 3 minutes and in an N₂ atmosphere. Then, an SiO₂ film 30 with a thickness of 300 nm is formed by a plasma CVD method so that the whole surface of the first metal layer 20a is covered with the SiO₂ film 30. Then, through-holes 31 each having a diameter of about 50 nm and passing through the SiO₂ film 30 are provided by etching in the same manner as in the light-emitting element 1 (see FIGS. 1 and 2).

Then, a Ti layer 41 with a thickness of 50 nm and an Au layer 42 with a thickness of 1,500 nm are formed successively on the SiO₂ film 30 by vapor deposition. Thus, a second metal layer 40a is formed. After these steps, the wafer is separated into chips by use of a scriber or the like.

Figure 4:
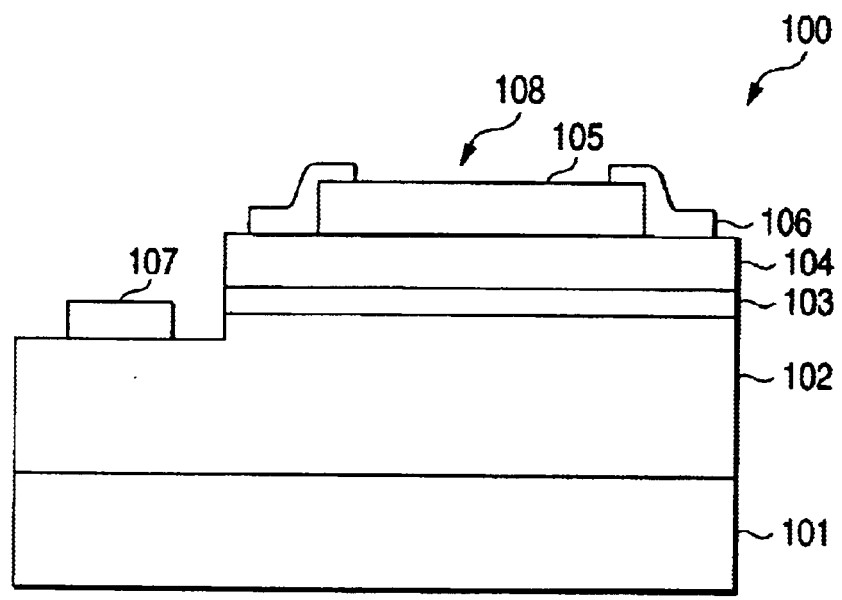
FIG. 4 is a schematic sectional view showing the configuration of a related-art light-emitting element.
Figure 5:
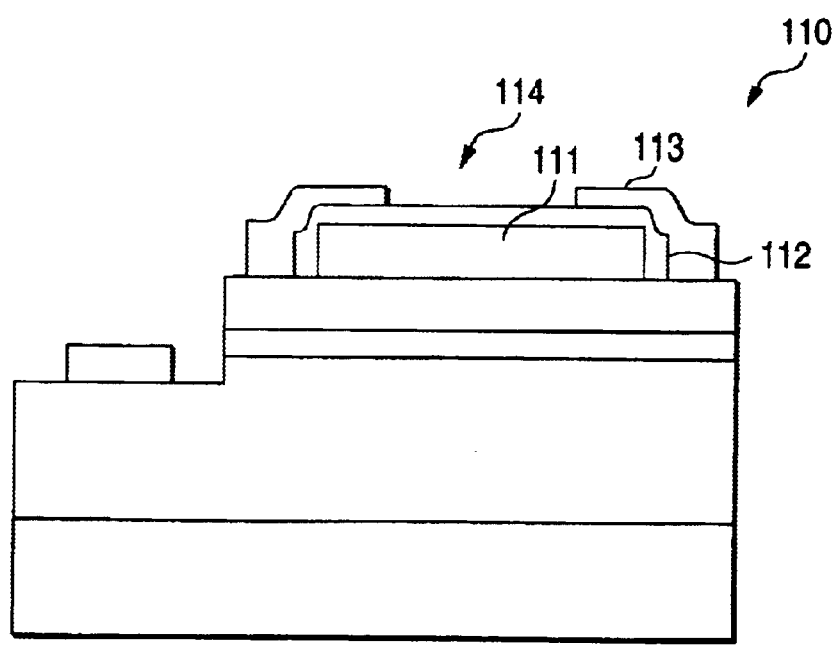
FIG. 5 is a schematic sectional view showing the configuration of another related-art light-emitting element.

The reliability of the light-emitting element 2 obtained thus is evaluated in comparison with the related-art configuration (FIG. 4). The reliability (durability) is evaluated on the basis of Ir which is measured after current conduction is performed continuously for 1,000 hours in the condition of temperature 85° C., humidity 85% and If (forward)=5 mA. As a result, Ir (reverse) in all of 10 samples of the light-emitting element 2 is smaller than 1 μA whereas Ir in 4 of 10 samples of the related-art light-emitting element (FIG. 4) is not smaller than 10 μA. It is confirmed that the light-emitting element 2 has high reliability because migration of Ag can be prevented. Because Ag exhibits high reflectance to the emitted light, it is also confirmed that luminous intensity in the configuration of Embodiment 1 (light-emitting element 1) is increased by about 40% and luminous intensity in the configuration of Embodiment 2 (light-emitting element 2) is increased by about 30% compared with the related-art configuration.

Embodiment 3

Figure 6:
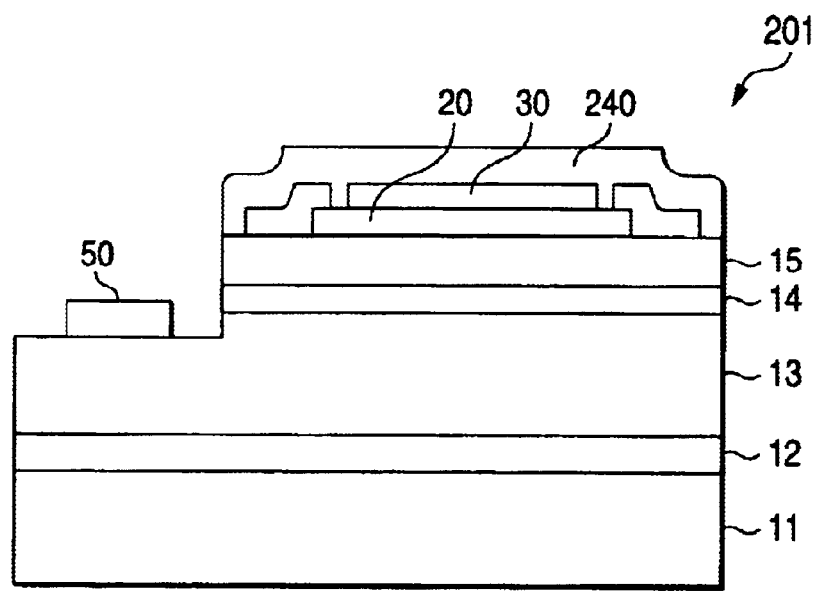
FIG. 6 is a schematic sectional view of a light-emitting element as still another embodiment of the invention.

A light-emitting element as a third embodiment of the invention will be described with reference to FIG. 6. The same reference numbers are used for the same parts illustrated in FIG. 1, and the explanation of such parts is omitted.

In a light-emitting element 201 according to the present embodiment, in addition to the configuration of the light-emitting element 1 in FIG. 1, the periphery of the second metal layer is expanded to cover the whole upper surface and the side surfaces of the protective film 30. By perfectly covering the protective film 30 with a second metal layer 240 as configured in this embodiment, the reflection amount of the emitted light by the second metal layer may be increased to enhance the light emission intensity as well as migration of the first metal layer may be securely prevented.

Embodiment 4

Figure 7:
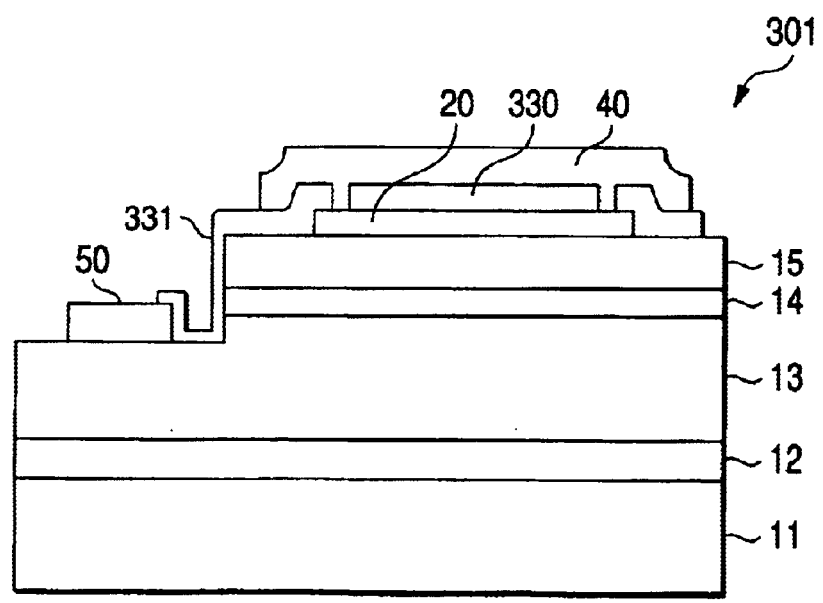
FIG. 7 is a schematic sectional view of a light-emitting element as still another embodiment of the invention.

A light-emitting element as a fourth embodiment of the invention will be described with reference to FIG. 7. The same reference numbers are used for the same parts illustrated in FIG. 1, and the explanation of such parts is omitted.

In a light-emitting element 301 according to the present embodiment, in addition to the configuration of the light-emitting element 1 in FIG. 1, the protective film is extended to form an extended part 331 to there by also cover an etching end face (junction part). The occurrence of leak current can be prevented under this configuration. In order to more securely prevent the occurrence of the leak current, it is preferable to cover also apart of the surface of the n-side electrode 50 by a protective film 330 as shown in FIG. 7.

Embodiment 5

Figure 8:
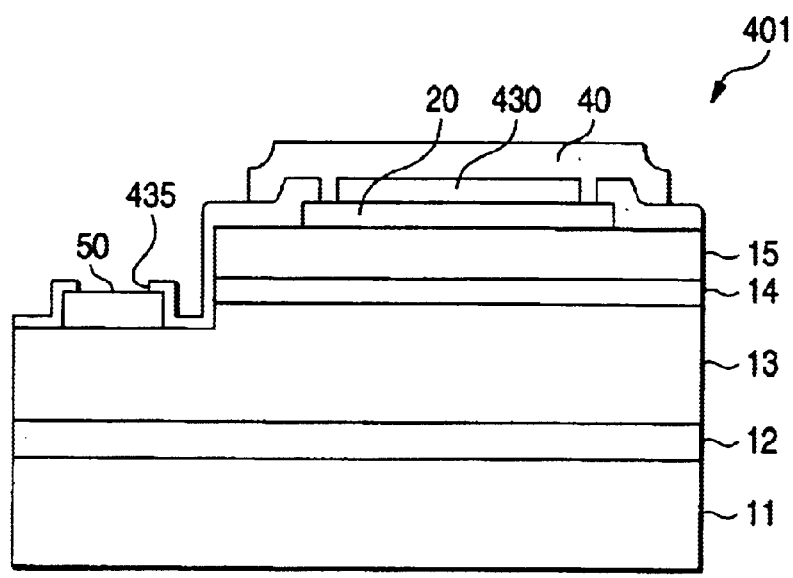
FIG. 8 is a schematic sectional view of a light-emitting element as still another embodiment of the invention.

A light-emitting element as a fifth embodiment of the invention will be described with reference to FIGS. 8 and 9. The same reference numbers are used for the same parts illustrated in FIG. 1, and the explanation of such parts is omitted.

Figure 9:
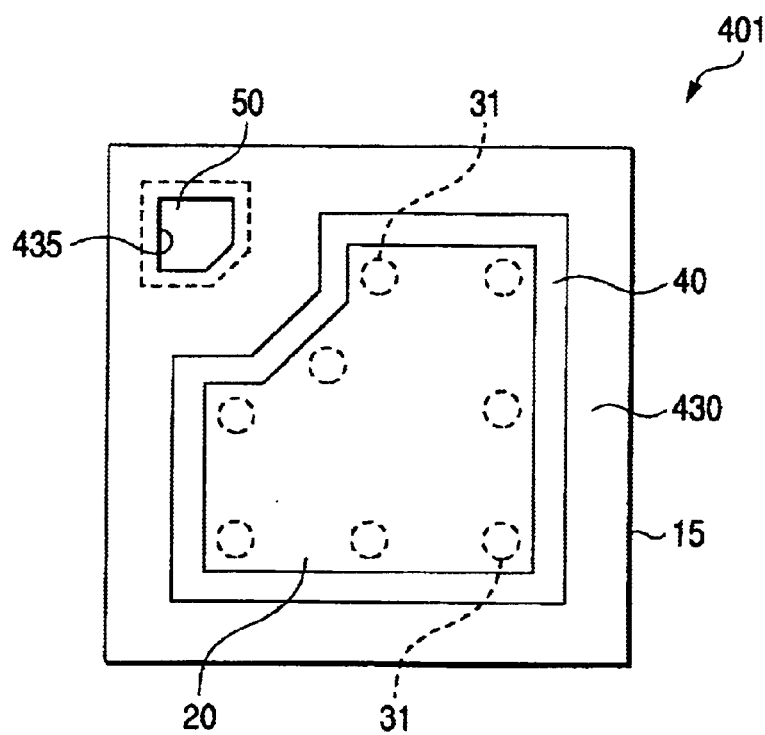
FIG. 9 is a plan view of the light-emitting element shown in FIG. 8.

In a light-emitting element 401 according to the present embodiment, in addition to the configuration of the light-emitting element 1 in FIG. 1, the protective film is extended to cover substantially the whole surface of the element except the surface of the n-side electrode 50 as illustrated in FIG. 9. The reference number 435 designates an opening of a protective film 430. The occurrence of leak current can be prevented by covering the whole surface of the element with the protective film 430.

This invention is not at all limited to the description of the mode for carrying out the invention. This invention includes various modifications that can be conceived easily by those skilled in the art, without departing from the scope of claim.

The following items will be disclosed.

(10) A Group III nitride compound semiconductor light-emitting element according to the present invention, wherein the thickness of the first metal layer is in a range of from 50 nm to 3,000 nm.

(11) A Group III nitride compound semiconductor light-emitting element according to the present invention and the item (10), wherein the thickness of the protective film is in a range of from 50 nm to 5,000 nm.

(12) A Group III nitride compound semiconductor light-emitting element according to the present invention and the items (10) and (11), wherein the thickness of the second metal layer is in a range of from 100 nm to 10 μm.

(20) A Group III nitride compound semiconductor light-emitting element according to the present invention and the items (10) through (12), wherein the diameter of the hole is not larger than 50 μm.

(21) A Group III nitride compound semiconductor light-emitting element according to the present invention and the items (10) through (12), wherein the diameter of the hole is in a range of from 1 μm to 50 μm.

(30) A p-side electrode for a Group III nitride compound semiconductor light-emitting element includes: a first metal layer containing Ag and formed on a p-type semiconductor layer; an electrically insulating protective film with which the first metal layer except a part region is covered; and a second metal layer not containing Ag and formed on the protective film.

(31) A p-side electrode for a Group III nitride compound semiconductor light-emitting element according to the item (30), wherein: the protective film is formed so that an upper surface and side surfaces of the first metal layer are wholly covered with the protective film; and the protective film has through-holes which reach the upper surface of the first metal layer.

(32) A p-side electrode for a Group III nitride compound semiconductor light-emitting element according to the item (30) or (31), wherein the first metal layer contains at least one member selected from the group consisting of Ni, Co, Au, Pd, and Pt.

(33) A p-side electrode for a Group III nitride compound semiconductor light-emitting element according to any one of the items (30) through (32), wherein the protective film is made of one member selected from the group consisting of silicon oxide, silicon nitride, aluminum oxide, and titanium nitride.

(34) A p-side electrode for a Group III nitride compound semiconductor light-emitting element according to any one of the items (30) through (33), wherein the second metal layer contains at least one member selected from the group consisting of Ti, Au, V, Ni, Cr, Zr, Co, Rh, Pt, Cu, Al, Mg, Pd, Mn, Bi, Sn, and Re.

(35) A p-side electrode for a Group III nitride compound semiconductor light-emitting element according to any one of the items (30) through (34), wherein the first metal layer is constituted by a plurality of layers different in composition.

(36) A p-side electrode for a Group III nitride compound semiconductor light-emitting element according to any one of the items (30) through (35), wherein the second metal layer is constituted by a plurality of layers different in composition.

(50) A method of manufacturing a Group III nitride compound semiconductor light-emitting element provided with a p-side electrode and an n-side electrode both formed on one surface side, the method including:

a first step of forming a first metal layer containing Ag on a p-type semiconductor layer;

a second step of forming an electrically insulating protective film with which the first metal layer is covered except a part region; and a third step of forming a second metal layer not containing Ag on the protective film.

(51) A method of manufacturing a Group III nitride compound semiconductor light-emitting element according to the item (50), wherein the second step includes the steps of: forming an electrically insulating protective film with which the first metal layer is covered; and forming at least one through-hole in the protective film so that the through-hole reaches a surface of the first metal layer.

(52) A method of manufacturing a Group III nitride compound semiconductor light-emitting element according to the item (50) or (51), further including a step of heating the first metal layer at a temperature not higher than the decomposition temperature of Group III nitride compound semiconductor, the step being carried out between the first step and the second step.

(53) A method of manufacturing a Group III nitride compound semiconductor light-emitting element according to the item (52), wherein the heating step is carried out at a temperature in a range of from 400° C. to 700° C.

What is claimed is:

1. A Group III nitride compound semiconductor light-emitting element having a p-side electrode and an n-side electrode both formed on one surface side, wherein said p-side electrode comprises:

a first metal layer containing Ag and formed on a p-type semiconductor layer;

an electrically insulating protective film with which said first metal layer is covered except a part region thereof; and a second metal layer not containing Ag, said second metal layer being formed on said protective film and contacting said first metal layer at said part region of said first metal layer.

2. A Group III nitride compound semiconductor light-emitting element according to claim 1, wherein said protective film is formed so that an upper surface and side surfaces of said first metal layer are wholly covered with said protective film, and said protective film has a through hole which reaches said upper surface of said first metal layer.

3. A Group III nitride compound semiconductor light-emitting element according to claim 1, wherein said first metal layer further contains at least one member selected from a group consisting of Ni, Co, Au, Pd, and Pt.

4. A Group III nitride compound semiconductor light-emitting element according to claim 1, wherein said protective film is made of one member selected from a group consisting of silicon oxide, silicon nitride, aluminum oxide, and titanium nitride.

5. A Group III nitride compound semiconductor light-emitting element according to claim 1, wherein said second metal layer contains at least one member selected from a group consisting of Ti, Au, V, Ni, Cr, Zr, Co, Rh, Pt, Cu, Al, Mg, Pd, Mn, Bi, Sn, and Re.

6. A Group III nitride compound semiconductor light-emitting element according to claim 1, wherein said first metal layer is constituted by a plurality of layers different in composition.

7. A Group III nitride compound semiconductor light-emitting element according to claim 1, wherein said second metal layer is constituted by a plurality of layers different in composition.

* * * * *